(12) United States Patent
Rogers (10) Patent No.: US 11,546,995 B2
(45) Date of Patent: Jan. 3, 2023

(54) METHOD OF FORMING A LOW LOSS ELECTRONICS ASSEMBLY

(71) Applicant: THE BOEING COMPANY, Chicago, IL (US)

(72) Inventor: John E. Rogers, Huntsville, AL (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 17/519,653

(22) Filed: Nov. 5, 2021

(65) Prior Publication Data

US 2022/0061161 A1 Feb. 24, 2022

Related U.S. Application Data (63) Continuation of application No. 16/598,595, filed on Oct. 10, 2019, now Pat. No. 11,197,376.

(51) Int. Cl.
| | | |
|---|---|---|
| *H01P 3/08* | (2006.01) | |
| *H05K 1/18* | (2006.01) | |
| *H05K 1/02* | (2006.01) | |
| *B29C 64/141* | (2017.01) | |
| *H05K 1/14* | (2006.01) | |
| *H05K 3/36* | (2006.01) | |
| *H05K 3/10* | (2006.01) | |

(52) U.S. Cl.
CPC .......... *H05K 1/185* (2013.01); *B29C 64/141* (2017.08); *H05K 1/0237* (2013.01); *H05K 1/148* (2013.01); *H05K 3/108* (2013.01); *H05K 3/361* (2013.01)

(58) Field of Classification Search
CPC ...... H05K 1/185; H05K 1/148; H05K 1/0237; H05K 3/108; H05K 3/361; B29C 64/141
See application file for complete search history.

(56) References Cited

U.S. PATENT DOCUMENTS

| | | | | |
|---|---|---|---|---|
| 5,461,545 A * | 10/1995 | Leroy | ................... | H05K 3/284 174/394 |
| 5,639,989 A * | 6/1997 | Higgins, III | .......... | H01L 23/552 174/394 |
| 7,259,041 B2 * | 8/2007 | Stelzl | ................... | H03H 9/1078 257/659 |
| 7,752,751 B2 * | 7/2010 | Kapusta | ................ | C23C 14/046 427/96.4 |
| 8,704,341 B2 * | 4/2014 | Lin | ....................... | H01L 23/552 257/659 |
| 9,883,596 B2 * | 1/2018 | Göbl | ....................... | H01L 24/50 |
| 2005/0045358 A1 * | 3/2005 | Arnold | ................... | H05K 9/003 174/51 |
| 2009/0000114 A1 * | 1/2009 | Rao | ...................... | H05K 1/0218 361/767 |

\* cited by examiner

*Primary Examiner* — Binh B Tran
(74) *Attorney, Agent, or Firm* — The Small Patent Law Group LLC; Joseph M. Butscher (57) ABSTRACT

A method of forming an electronics assembly includes providing a substrate, attaching an electronics component to the substrate, disposing one or more dielectric ramps on the substrate along at least a portion of a perimeter of the electronics component, disposing a first ground plane over the substrate and the dielectric ramp(s), disposing a first dielectric over the first ground plane, disposing a stripline over the first dielectric, disposing a second dielectric over the stripline and the first dielectric, and disposing a second ground plane over the second dielectric.

20 Claims, 6 Drawing Sheets

METHOD OF FORMING A LOW LOSS ELECTRONICS ASSEMBLY

RELATED APPLICATIONS

This application is a continuation of U.S. patent application Ser. No. 16/598,595, entitled "Method of Forming a Low Loss Electronics Assembly," filed Oct. 10, 2019, now U.S. Pat. No. 11,197,376, which is hereby incorporated by reference in its entirety.

FIELD OF EMBODIMENTS OF THE DISCLOSURE

Embodiments of the present disclosure generally relate to a low loss electronics assembly, and more particularly, to a method of forming a low loss electronics assembly.

BACKGROUND OF THE DISCLOSURE

Flexible hybrid electronics (FHE) combine the functionality of rigid printed circuit boards with the adaptability of flexible circuits. FHEs are becoming increasingly desirable due to their potential to provide flexible, low size, low weight, low power, and low cost sensors and systems.

Certain FHEs may be formed through additive manufacturing techniques. However, known additive printing techniques may not effectively integrate electronics onto FHE boards. Further, FHEs formed through known techniques may not effectively dissipate heat away from high power electronics, such as power amplifiers.

Known methods for attaching packaged and die electronics to FHE boards include face up methods and face down methods. Face down methods typically utilize anisotropic conductive films or pastes to provide conductive spheres, which may not effectively dissipate heat in relation to an FHE assembly. Face up methods typically utilize printed lines to attach to portions of electronics, but also may not effectively dissipate heat. For example, the printed lines are typically not connected to a ground plane.

Moreover, certain FHE assemblies may be formed through chemical deposition (such as chemical vapor deposition, plasma enhanced chemical vapor deposition, atomic layer deposition, or molecular layer deposition) or physical deposition (such as physical vapor deposition, thermal evaporation, or sputtering deposition). However, such process typically are conduced in a clean room, which increases manufacturing costs, and typically exhibit a low deposition rate, and increased material waste, thereby further increasing manufacturing costs.

SUMMARY OF THE DISCLOSURE

A need exists for an effective method for forming an electronics assembly, such as an FHE assembly, which is configured to effectively dissipate heat generated by an electronics component. Further, a need exists for a cost effective method of forming an electronics assembly, such as an FHE assembly.

With those needs in mind, certain embodiments of the present disclosure provide a method of forming an electronics assembly. The method includes providing a substrate, attaching an electronics component to the substrate, disposing one or more dielectric ramps on the substrate along at least a portion of a perimeter of the electronics component, disposing a first ground plane over the substrate and the dielectric ramp(s), disposing a first dielectric over the first ground plane, disposing a stripline over the first dielectric, disposing a second dielectric over the stripline and the first dielectric, and disposing a second ground plane over the second dielectric.

Said disposing the dielectric ramp(s) may include printing the dielectric ramp(s). Said disposing the first ground plane may include printing the first ground plane. Said disposing the first dielectric may include printing the first dielectric. Said disposing the stripline may include printing the stripline. Said disposing the second dielectric may include printing the second dielectric. Said disposing the second ground plane may include printing the second ground plane.

In at least one embodiment, said disposing the stripline includes extending the stripline to contact at least one pad of the electronics component.

In at least one embodiment, said disposing the second dielectric includes disposing the second dielectric over the electronics component.

In at least one embodiment, the method includes interconnecting the first ground plane and the second ground plane. For example, said interconnecting includes interconnecting the first ground plane and the second ground plane with interconnects.

In at least one embodiment, the method includes interconnecting the electronics component and the second ground plane. For example, said interconnecting includes interconnecting a ground paddle of the electronics component and the second ground plane with interconnects.

In at least one embodiment, the method includes interconnecting the first ground plane and the second ground plane with first interconnects, and interconnecting a ground paddle of the electronics component and the second ground plane with second interconnects.

In at least one embodiment, said disposing the first ground plane includes refraining from disposing the first ground plane over the electronics component.

Certain embodiments of the present disclosure provide an electronics assembly that includes a substrate, an electronics component attached to the substrate, one or more dielectric ramps disposed on the substrate along at least a portion of a perimeter of the electronics component, a first ground plane disposed over the substrate and the dielectric ramp(s), a first dielectric disposed over the first ground plane, a stripline disposed over the first dielectric, a second dielectric disposed over the stripline and the first dielectric, and a second ground plane disposed over the second dielectric.

DETAILED DESCRIPTION OF THE DISCLOSURE

The foregoing summary, as well as the following detailed description of certain embodiments, will be better understood when read in conjunction with the appended drawings. As used herein, an element or step recited in the singular and preceded by the word "a" or "an" should be understood as not necessarily excluding the plural of the elements or steps. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Certain embodiments of the present disclosure provide a method of forming an electronics assembly that is configured to effectively dissipate heat. The method includes printing at least one dielectric ramp in relation to an electronics component that is attached to a substrate, such as an FHE board. A first ground plane is printed over the dielectric ramp(s). A first dielectric is printed on the first ground plane. A stripline is then printed over the first dielectric and connects to at least one pad of the electronics component. A second dielectric is printed over the stripline, the first dielectric, and the electronics component. A second ground plane is printed over the second dielectric. First interconnects connect the second ground plane to the first ground plane, and second interconnects connect the upper portions of the electronics component to the second ground plane. In this manner, heat generated by the electronics component is drawn away from the electronics component through the second interconnects, and dissipated over the second ground plane. The heat then is dissipated to and across the first ground plane through the first interconnects.

Embodiments of the present disclosure provide an additive printing method that is used to integrate an electronics component onto a substrate, such as an FHE board. The method provides an electronics assembly that redistributes stress caused by bending of the substrate, and effectively dissipates heat away from the electronics component. The method provides an electronics assembly that includes a first ground layer, a stripline, and a second ground layer. The first ground layer and the second ground layer are electrically connected through interconnects, thereby allowing heat generated by the electronics component to be effectively spread through the assembly. As such, the electronics component may operate at relatively high temperatures because generated heat is effectively dissipated through the electronics assembly.

Certain embodiments of the present disclosure provide an electronics assembly including a printed stripline (for example, an RF stripline) electrically coupled to first and second printed ground planes. Electrical interconnects (for example, electrical vias) electrically short the first and second ground planes. A dielectric ramp is printed under the stripline to route the stripline from a substrate (such as an FHE board) to pads of an electronics component. The second printed ground plane extends above the electronics, thereby providing an electrical path to ground, as well as a path that effectively dissipates heat away from the electronics component. The dielectric ramp redistributes stress in relation to the electronics component and the substrate, as the substrate bends, thereby providing a robust assembly. The electronics assembly may be formed through additive manufacturing techniques, such as printing and/or film deposition.

Figure 1:
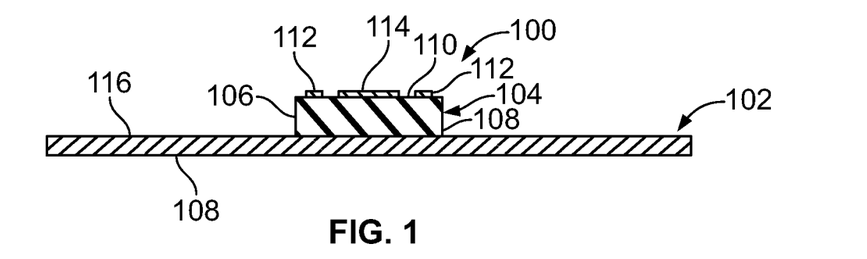
FIG. 1 illustrates a lateral view of an electronics component mounted on a substrate, according to an embodiment of the present disclosure.

FIG. 1 illustrates a lateral view of an electronics component 100 mounted on a substrate 102, according to an embodiment of the present disclosure. The electronics component 100 may be one or more of an integrated circuit, a processor, a power amplifier, a pre-amplifier, a mixer, a filter, an attenuator, or the like. In at least one embodiment, the electronics component 100 includes a base 104 having a perimeter wall 106, a bottom surface 108, and a top surface 110. Contact pads 112, such as input pads and output pads, extend from the top surface 110. The contact pads 112 may be proximate to the perimeter wall 106. A ground paddle 114 extends from the top surface 110. The ground paddle 114 may be centrally located on the top surface 110, and may be inboard from the contact pads 112.

In at least one embodiment, the substrate 102 is a flexible board, such as a flexible FHE board. The substrate 102 includes a first or upper surface 116 that is opposite from a second or lower surface 118.

In order to form an electronics assembly, such as an FHE assembly, the electronics component 100 is first secured to the substrate 102 For example, the electronics component 100 may be located at a desired position in relation to the substrate 102, and the bottom surface 108 of the electronics component 100 is secured to the first surface 116 of the substrate 102, such as through an adhesive.

Figure 2:
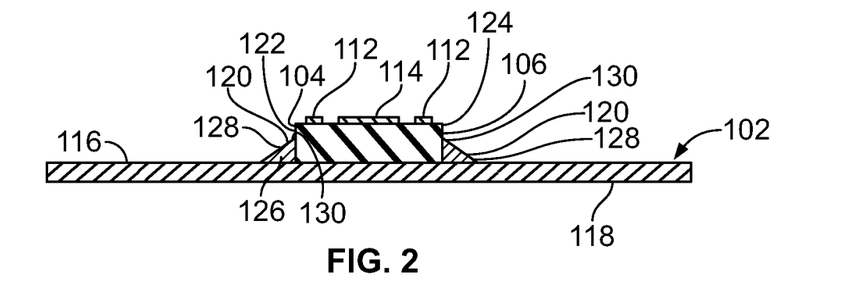
FIG. 2 illustrates a lateral view of dielectric ramps connected to the electronics component and the substrate, according to an embodiment of the present disclosure.

FIG. 2 illustrates a lateral view of dielectric ramps 120 connected to the electronics component 100 and the substrate 102, according to an embodiment of the present disclosure. After the electronics component 100 is secured to the substrate 102, the dielectric ramps 120 are formed on the substrate 102. For example, the dielectric ramps 120 are printed onto the substrate 102 and abut against the perimeter wall 106 of the electronics component 100. Two dielectric ramps 120 may be formed against the perimeter wall 106. The dielectric ramps 120 are opposite from one another. For example, the dielectric ramps 120 may be formed at opposite ends 122 and 124 of the electronics component 100. Alternatively, the dielectric ramps 120 may be formed around the entire perimeter wall 106 of the base 104. The dielectric ramps 120 may be formed of epoxy, polyimide, ultraviolet curable dielectrics, thermal curable dielectrics, and/or the like.

Each dielectric ramp 120 includes an expanded base 126 on the first surface 116 of the substrate 102. The expanded base 126 extends to a lower portion of the perimeter wall 106 of the electronics component 100. The expanded base 126 connects to an angled upper surface 128 that angles towards the perimeter wall 106 and terminates at a reduced peak 130 that connects to the perimeter wall 106. The reduced peak 130 may not extend to the top surface 110 of the electronics component 100, and therefore may not connect to any of the pads 112.

Figure 3:
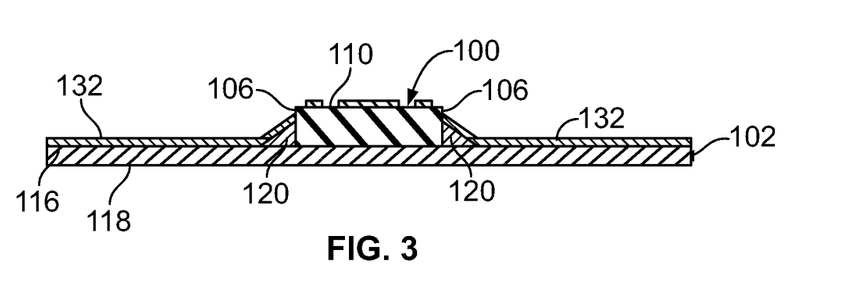
FIG. 3 illustrates a lateral view of a first ground plane formed over a first surface of the substrate and the dielectric ramps, according to an embodiment of the present disclosure.

FIG. 3 illustrates a lateral view of a first ground plane 132 formed over the first surface 116 of the substrate 102 and the dielectric ramps 120, according to an embodiment of the present disclosure. The first ground plane 132 may be formed by printing the first ground plane 132 over the first surface 116 and the dielectric ramps 120. The first ground plane 132 may not extend over the electronics component 100. That is, the first ground plane 132 may not extend onto the top surface 110 of the electronics component 100. Instead, the first ground plane 132 connects to the perimeter wall 106 of the electronics component 100 below the top surface 110.

Figure 4:
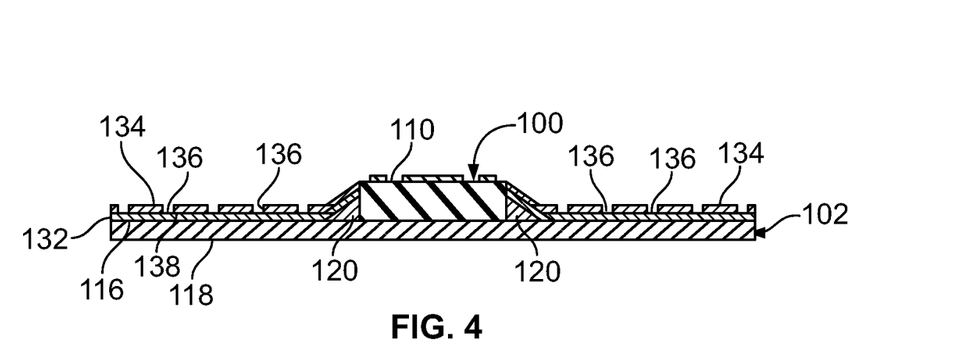
FIG. 4 illustrates a lateral view of a first dielectric formed over the first ground plane, according to an embodiment of the present disclosure.

FIG. 4 illustrates a lateral view of a first dielectric 134 formed over the first ground plane 132, according to an embodiment of the present disclosure. The first dielectric 134 may be formed by printing the first dielectric 134 over the first ground plane 132. The first dielectric 134 may extend to, but may not extend over, the top surface 110 of the electronics component 100.

A plurality of first interconnect passages 136 are formed through the first dielectric 134. The first interconnect passages 136 provide channels to a top surface 138 of the first ground plane 132. The first interconnect passages 136 are configured to receive and retain interconnects, such as electrical vias. The first interconnect passages 136 may be formed away from a central longitudinal plane of the substrate 102. The first dielectric 134 may include more or less first interconnect passages 136 than shown.

Figure 5:
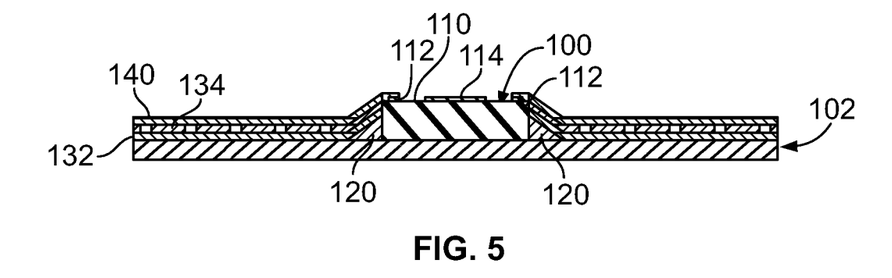
FIG. 5 illustrates a lateral view of a stripline formed over the first dielectric, according to an embodiment of the present disclosure.

FIG. 5 illustrates a lateral view of a stripline 140 formed over the first dielectric 132, according to an embodiment of the present disclosure. In at least one embodiment, the stripline 140 is a transverse electromagnetic (TEM) transmission line, which may include a flat strip of conductor sandwiched between parallel ground planes.

The stripline 140 may be formed by printing the stripline 140 over the first dielectric 134. The stripline 140 may not be positioned over the first interconnect passages 136. In at least one embodiment, the stripline 140 may be formed over and/or within the central longitudinal plane of the substrate 102. The stripline 140 is formed onto the top surface 110 of the electronics component 100 to electrically connect to the pads 112, but may not extend to the ground paddle 114.

Figure 6:
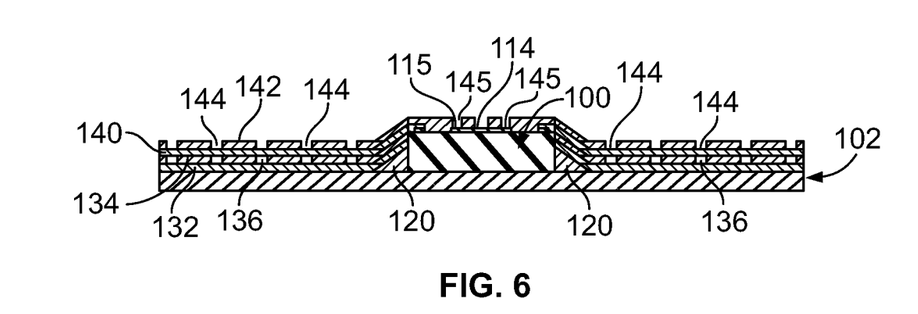
FIG. 6 illustrates a lateral view of a second dielectric formed over the stripline, according to an embodiment of the present disclosure.

FIG. 6 illustrates a lateral view of a second dielectric 142 formed over the stripline 140, according to an embodiment of the present disclosure. The second dielectric 142 may be formed by printing the second dielectric 142 over the stripline 140 and the first dielectric 134. The second dielectric 142 also extends over the top surface 110 of the electronics component 100, including the ground paddle 114.

A plurality of second interconnect passages 144 are formed through the second dielectric 142. The second interconnect passages 144 axially align with the first interconnect passages 136. The aligned first and second interconnect passages 136 and 144 are configured to receive and retain interconnects, such as electrical vias. Like the first interconnect passages 136, the second interconnect passages 144 may be formed away from the central longitudinal plane of the substrate 102. The second dielectric 142 may include more or less second interconnect passages 144 than shown.

Third interconnect passages 145 are formed through the second dielectric 142 over the ground paddle 114. The third interconnect passages 145 provide channels to a top surface 115 of the ground paddle 114. The third interconnect passages 145 are configured to receive and retain interconnects, such as electrical vias.

It is to be understood that terms first, second, third, etc. are merely for labeling purposes. A first passage may be a second passage, or vice versa.

Figure 7:
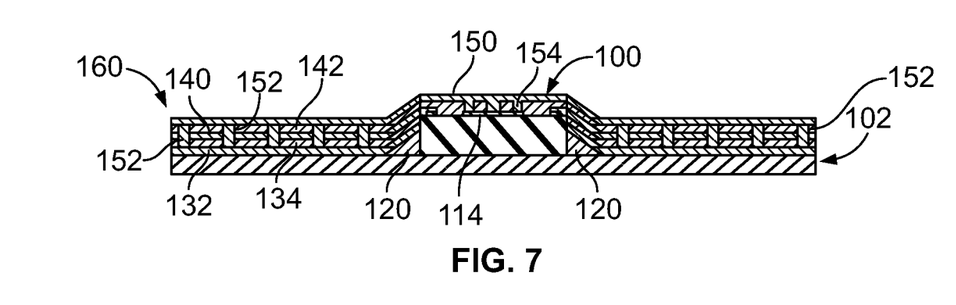
FIG. 7 illustrates a lateral view of a second ground plane formed over the second dielectric, thereby forming an electronics assembly, according to an embodiment of the present disclosure.

FIG. 7 illustrates a lateral view of a second ground plane 150 formed over the second dielectric 142, thereby forming an electronics assembly 160, according to an embodiment of the present disclosure. The second ground plane 150 may be formed by printing the second ground plane 150 over the second dielectric 142. The second ground plane 150 may be integrally formed with (such as through printing) first interconnects 152 (such as electrical vias) that are received and retained by the axially aligned first interconnect passages 136 and the second interconnect passages 142 (shown in FIG. 6). The first interconnects 152 do not extend through the stripline 140. The first interconnects 152 provide thermally-conductive paths between the first ground plane 132 and the second ground plane 150.

The second ground plane 150 may also be integrally formed with (such as through printing) second interconnects 154 (such as electrical vias) that are received and retained by the third interconnect passages 144. The second interconnects 154 provide thermally-conductive paths between the ground paddle 114 of the electronics component 100 and the second ground plane 150.

Heat generated by the electronics component 100 is drawn away from the electronics component 100 by the second interconnects 154 to the second ground plane 150. The heat is then dissipated over the second ground plane 150 away from the electronics component 100 to the first interconnects 152. The heat is then drawn through the first interconnects 152 to the first ground plane 132, where the heat is further dissipated over and across the first ground plane 132. Accordingly, embodiments of the present disclosure provide the electronics assembly 160, and method of forming the electronics assembly 160, that provides an effective heat dissipation path extending between the electronics component 100, the second interconnects 152, the second ground plane 150, the first interconnects 152, and the first ground plane 132. In this manner, heat generated by the electronics component 100 is effectively drawn away from the electronics component 100 to and throughout the first ground plane 132 and the second ground plane 150, thereby effectively dissipating heat within the electronics component 100.

It is to be understood that terms such as first, second, third, etc. are merely to identify and label different items. For example, a first interconnect may be considered a second interconnect, or vice versa. As another example, a first ground plane may be considered a second ground plane, and vice versa.

Figure 8:
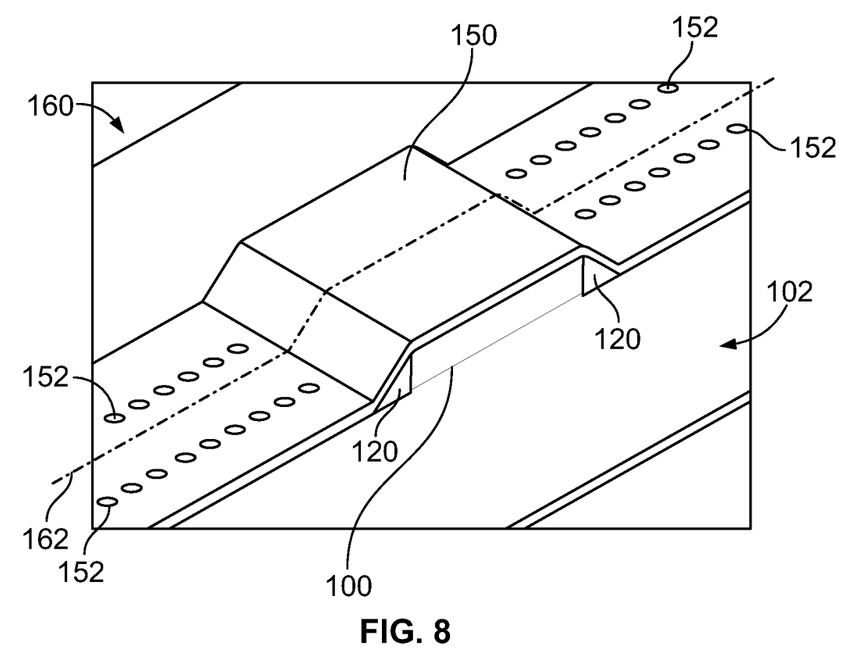
FIG. 8 illustrates a perspective top view of the electronics assembly.

FIG. 8 illustrates a perspective top view of the electronics assembly 160. As shown, the first interconnects 152 are positioned away from the central longitudinal plane 162 of the substrate 102, which may also be the central longitudinal plane 162 of the electronics assembly 160. The stripline 140 (shown in FIGS. 6 and 7) may be axially aligned with the central longitudinal plane 162. For example, the central longitudinal plane 162 may extend through the stripline 140. The first interconnects 152 do not extend through the stripline 140.

Figure 9:
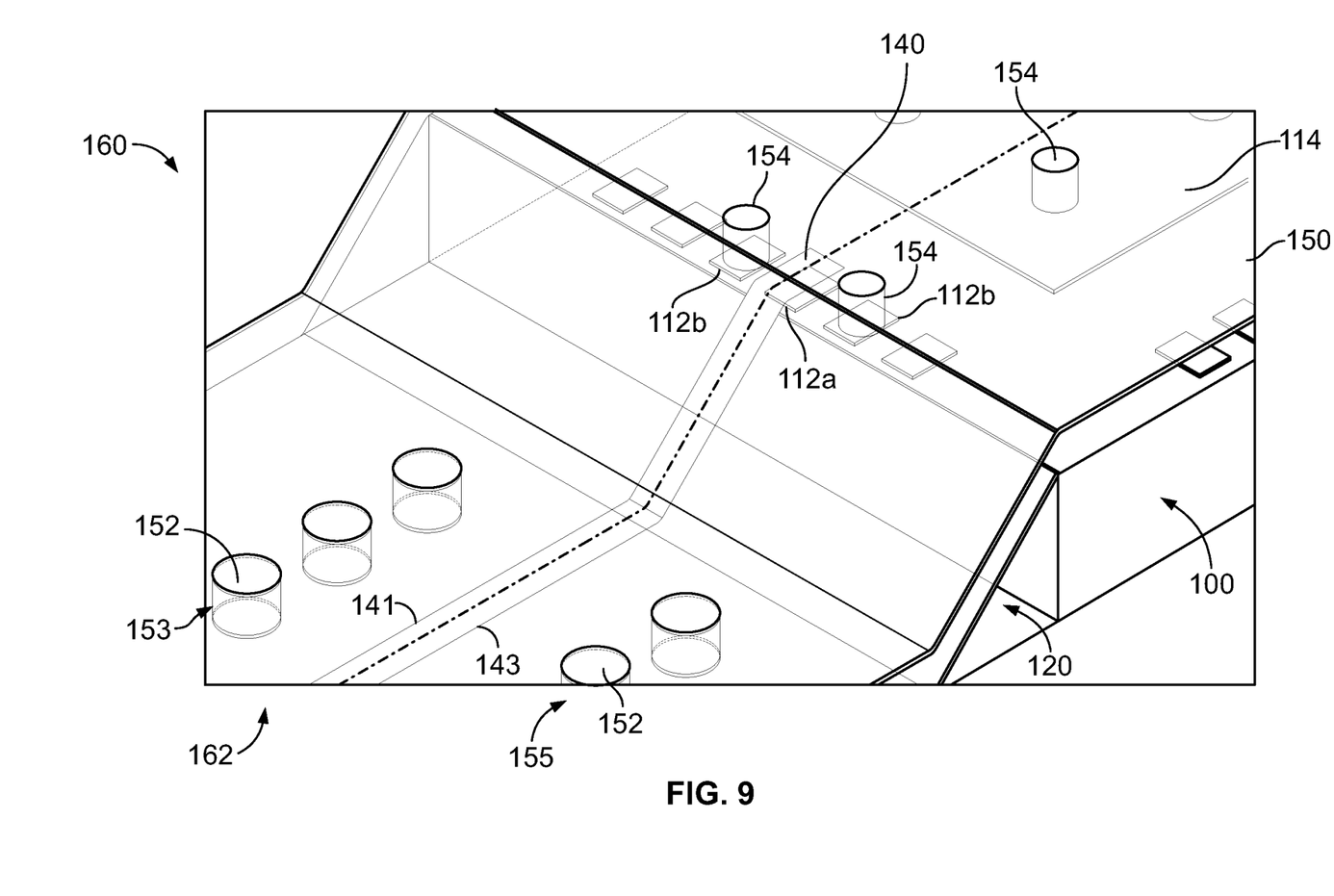
FIG. 9 illustrates a transparent perspective top view of a portion of the electronics assembly.

FIG. 9 illustrates a transparent perspective top view of a portion of the electronics assembly 160. As shown, the stripline 140 may be axially aligned with the central longitudinal plane 162. The first interconnects 152 are disposed laterally away from the stripline 140, such as away from both sides of the stripline 140. A first row 153 of first interconnects 152 may be positioned laterally away from a first side 141 of the stripline 140, and a second row 155 of first interconnects 152 may be positioned laterally away from a second side 143 of the stripline 140. Alternatively, the electronics assembly 160 may include one of the first row 153 or the second row 155 of first interconnects 152.

The stripline 140 electrically connects to a pad 112*a* of the electronics component 100. Pads 112*b* may connect to the second ground plane 150 through second interconnects 154. Optionally, the pads 112*b* may not connect to the second ground plane 150 through second interconnects 154.

Figure 10:
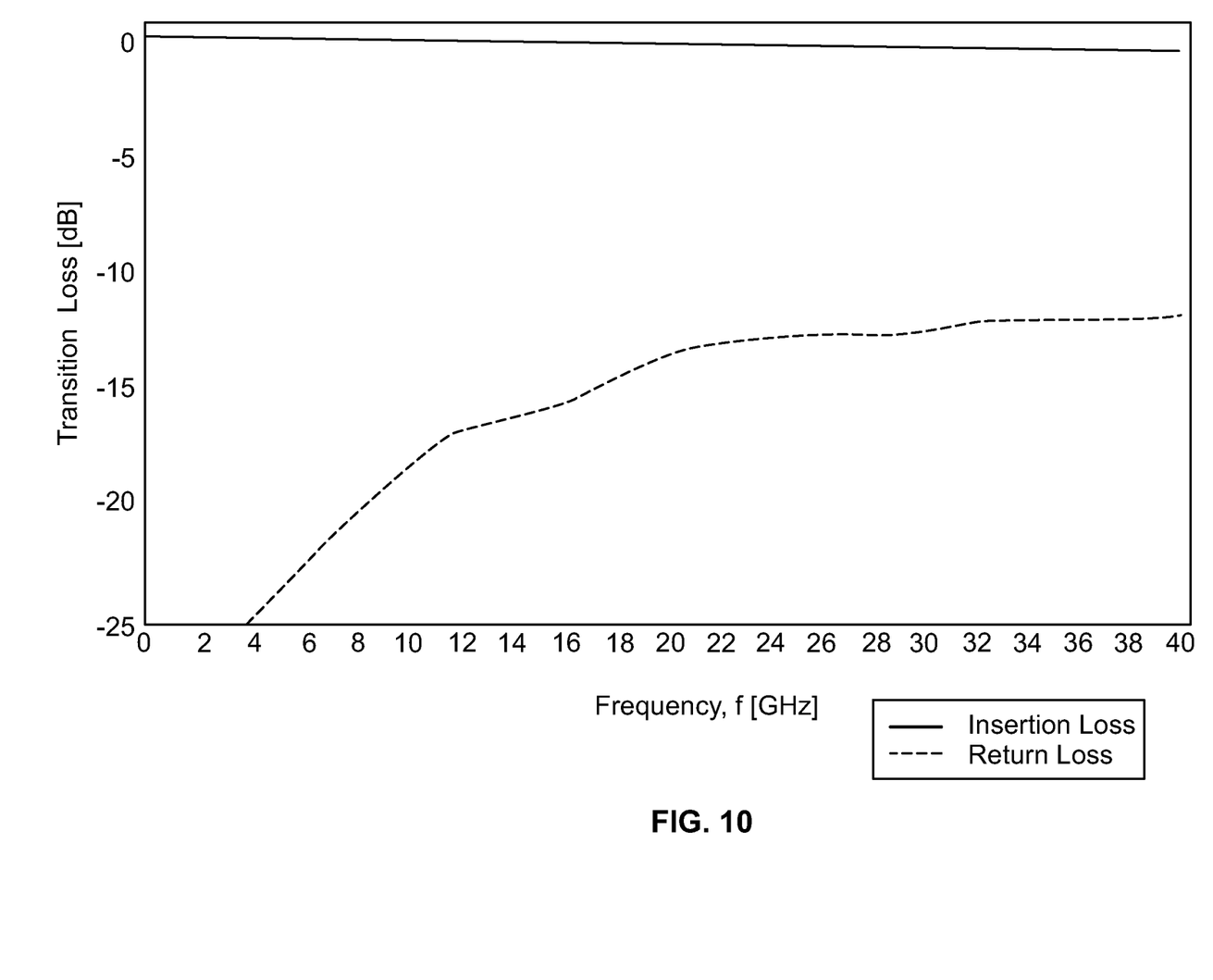
FIG. 10 illustrates a graph of transition loss in relation to frequency for an electronics assembly, according to an embodiment of the present disclosure.

FIG. 10 illustrates a graph of transition loss in relation to frequency for an electronics assembly, according to an embodiment of the present disclosure. A numerical model for a low loss printed stripline with a length of 11.5 mm with a 45 degree angle ramp was developed using a finite element method (FEM) solver to predict the performance thereof. The model for the low loss printed stripline predicts an insertion loss of ~0.58 dB up to 40 GHz and maintains a VSWR impedance bandwidth better than 2:1 across the frequency range of 40 GHz.

Figure 11:
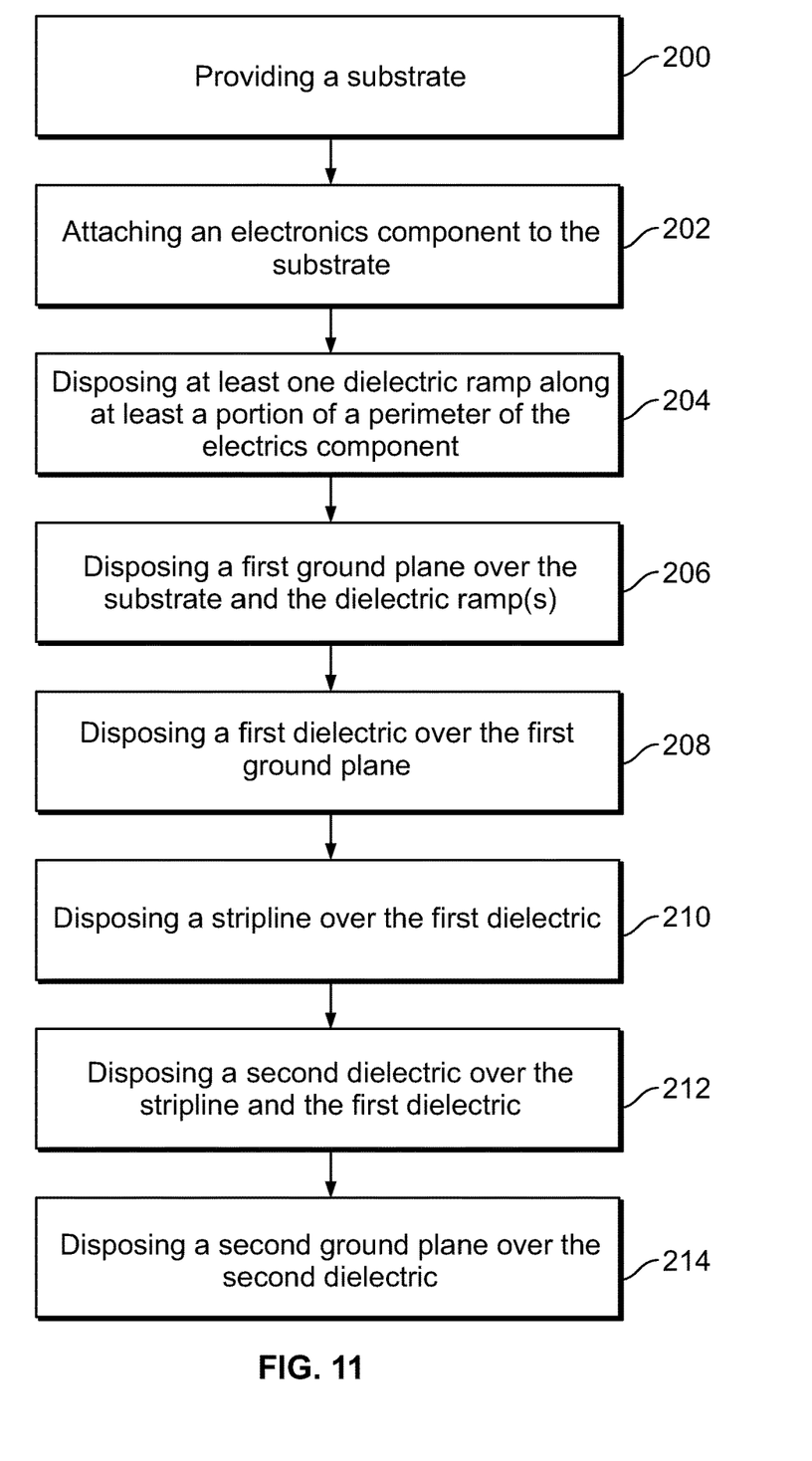
FIG. 11 illustrates a flow chart of a method of forming an electronics assembly, according to an embodiment of the present disclosure.

FIG. 11 illustrates a flow chart of a method of forming an electronics assembly, according to an embodiment of the present disclosure. Referring to FIGS. 1-11, the method includes providing (200) the substrate 102, attaching (202) the electronics component 100 to the substrate 102, and disposing (204) the dielectric ramp(s) 120 on the substrate 102 along at least a portion of the perimeter of the electronics component 100. The disposing (204) the dielectric ramp(s) 120 may include printing the dielectric ramp(s) 120.

The method also includes disposing (206) the first ground plane 132 over the substrate 102 and the dielectric ramp(s) 120. The disposing (206) the first ground plane 132 may include printing the first ground plane 132. In at least one embodiment, the disposing (206) the first ground plane 132 includes refraining from disposing the first ground plane 132 over the electronics component 100.

Next, the method includes disposing (208) the first dielectric 134 over the first ground plane 132. The disposing (208) the first dielectric 134 may include printing the first dielectric 134.

Next, the method includes disposing (210) the stripline 140 over the first dielectric 132. The disposing (210) the stripline 140 includes extending the stripline 140 to contact at least one pad 112 of the electronics component 100. The disposing (210) the stripline 140 may include printing the stripline 140.

The method also includes disposing (212) the second dielectric 142 over the stripline 140 and the first dielectric 134. In at least one embodiment, the disposing (212) the second dielectric 142 includes disposing the second dielectric 142 over the electronics component 100. The disposing (210) the second dielectric 142 may include printing the second dielectric 142.

The method also includes disposing (214) the second ground plane 150 over the second dielectric 142. The disposing (214) the second ground plane 150 may include printing the second ground plane 150.

In at least one embodiment, the method also includes interconnecting the first ground plane 132 and the second ground plane 150, such as through the first interconnects 152. Further, in at least one embodiment, the method also includes interconnecting the electronics component 100 and the second ground plane 150, such as through the second interconnects 154.

As described herein, embodiments of the present disclosure provide an effective method for forming an electronics assembly, such as an FHE assembly. Embodiments of the present disclosure also provide an electronics assembly that is configured to effectively dissipate heat generated by an electronics component. Further, embodiments of the present disclosure provide a cost-effective method of forming an electronics assembly, such as an FHE assembly.

While various spatial and directional terms, such as top, bottom, lower, mid, lateral, horizontal, vertical, front and the like may be used to describe embodiments of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the disclosure without departing from their scope. While the dimensions and types of materials described herein are intended to define the parameters of the various embodiments of the disclosure, the embodiments are by no means limiting and are exemplary embodiments. Many other embodiments will be apparent to those of skill in the art upon reviewing the above description. The scope of the various embodiments of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose the various embodiments of the disclosure, including the best mode, and also to enable any person skilled in the art to practice the various embodiments of the disclosure, including making and using any devices or systems and performing any incorporated methods. The patentable scope of the various embodiments of the disclosure is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. A method of forming an electronics assembly, the method comprising:
   disposing one or more dielectric ramps on a substrate along at least a portion of a perimeter of an electronics component;
   disposing a first ground plane over the substrate and the one or more dielectric ramps;
   disposing a first dielectric over the first ground plane; and
   disposing a stripline over the first dielectric.

2. The method of claim 1, further comprising disposing a second dielectric over the stripline and the first dielectric.

3. The method of claim 2, wherein said disposing the second dielectric comprises disposing the second dielectric over the electronics component.

4. The method of claim 2, further comprising disposing a second ground plane over the second dielectric.

5. The method of claim 4, further comprising interconnecting the first ground plane and the second ground plane.

6. The method of claim 4, further comprising interconnecting the electronics component and the second ground plane.

7. The method of claim 4, wherein said disposing the second dielectric comprises printing the second dielectric, and wherein said disposing the second ground plane comprises printing the second ground plane.

8. The method of claim 1, wherein said disposing the one or more dielectric ramps comprises printing the one or more dielectric ramps, wherein said disposing the first ground plane comprises printing the first ground plane, wherein said disposing the first dielectric comprises printing the first dielectric, and wherein said disposing the stripline comprises printing the stripline.

9. The method of claim 1, wherein said disposing the stripline comprises extending the stripline to contact at least one pad of the electronics component.

10. The method of claim 1, wherein said disposing the first ground plane comprises refraining from disposing the first ground plane over the electronics component.

11. An electronics assembly, comprising:
    an electronics component coupled to a substrate;
    one or more dielectric ramps disposed on the substrate;
    a first ground plane disposed over the substrate and the one or more dielectric ramps;
    a first dielectric disposed over the first ground plane; and
    a stripline disposed over the first dielectric.

12. The electronics assembly of claim 11, further comprising a second dielectric disposed over the stripline and the first dielectric.

13. The electronics assembly of claim 12, wherein the second dielectric is disposed over the electronics component.

14. The electronics assembly of claim 12, further comprising a second ground plane disposed over the second dielectric.

15. The electronics assembly of claim 14, wherein the first ground plane and the second ground plane are interconnected.

16. The electronics assembly of claim 14, wherein the electronics component and the second ground plane are interconnected.

17. The electronics assembly of claim 11, wherein the stripline contacts at least one pad of the electronics component.

18. The electronics assembly of claim 16, further comprising interconnects that interconnect a ground paddle of the electronics component and a second ground plane.

19. The electronics assembly of claim 11, further comprising:
    first interconnects that interconnect the first ground plane and a second ground plane; and
    second interconnects that interconnect a ground paddle of the electronics component and the second ground plane.

20. The electronics assembly of claim 11, wherein the first ground plane comprises does not extend over the electronics component.

* * * * *